United States Patent [19]

Nye, III et al.

[11] Patent Number: 5,629,564
[45] Date of Patent: May 13, 1997

[54] ELECTROPLATED SOLDER TERMINAL

[75] Inventors: Henry A. Nye, III, Bedford, N.Y.;
Jeffrey F. Roeder, Brookfield, Conn.;
Ho-Ming Tong, Yorktown Heights;
Paul A. Totta, Poughkeepsie, both of N.Y.

[73] Assignee: International Business Machines Corporation, Armonk, N.Y.

[21] Appl. No.: 392,718

[22] Filed: Feb. 23, 1995

Related U.S. Application Data

[62] Division of Ser. No. 267,339, Jun. 28, 1994, abandoned.

[51] Int. Cl.$^6$ .................................................. H01L 23/48
[52] U.S. Cl. ........................... 257/762; 257/763; 257/766
[58] Field of Search ................................ 257/766, 778, 257/751, 762, 763, 764, 750; 437/183

[56] References Cited

U.S. PATENT DOCUMENTS

| | | | |
|---|---|---|---|
| 3,633,076 | 1/1972 | Arnot et al. | 317/234 R |
| 4,290,079 | 9/1981 | Carpenter et al. | 257/766 |
| 4,434,434 | 2/1984 | Bhattacharya et al. | 357/71 |
| 4,840,302 | 6/1989 | Gardner et al. | 228/123 |
| 4,954,870 | 9/1990 | Takemura et al. | 357/67 |
| 4,985,750 | 1/1991 | Hoshino | 257/762 |
| 5,162,257 | 11/1992 | Yung | 437/183 |
| 5,268,072 | 12/1993 | Agarwala et al. | 156/664 |

OTHER PUBLICATIONS

R. J. Herdzik, et al., Barrier Layer Metallurgy for Aluminum Stripes, IBM Technical Disclosure Bulletin, V. 10, No. 12, p. 1979, May 1968.

P. A. Totta, et al., SLT Device Metallurgy and Its Monolithic Extension, IBM Jrl. of Research & Development, V. 13, No. 3, pp. 226–238, May 1969.

B. S. Berry, et al., Studies of the SLT Chip Terminal Metallurgy, IBM Jrl. of Research & Development, May 1969.

R. A. Leonard, et al., Chromium Barrier for Terminal Metallurgies,, IBM Technical Disclosure Bulletin, V. 13, No. 5, p. 1121, Oct. 1970.

H. M. Dalal, et al., Chromium–Copper Step–Phasing, IBM Technical Disclosure Bulletin, V. 20, No. 3, pp. 1005–1006, Aug. 1977.

T. Kawanobe, et al., Solder Bump Fabrication By Electrochemical Method for Flip Chip Interconnection, IEEE CH1671, pp. 149–155, 1981.

M. Warrier, Reliability Improvements in Solder Bump Processing for Flip Chips, IEEE 0569–5503, pp. 460–469, 1990.

*Primary Examiner*—Sara W. Crane
*Assistant Examiner*—Roy Potter
*Attorney, Agent, or Firm*—Kris V. Srikrishnan

[57] ABSTRACT

A structure for an improved solder terminal is disclosed. The improved solder terminal is made of a bottom metallic adhesion layer, a CrCu intermediate layer on top of the adhesion layer, a solder bonding layer above the CrCu layer and a solder top layer. The adhesion layer is either TiW or TiN. A process for fabricating an improved terminal metal consists of depositing an adhesive metallic layer, a layer of CrCu over the adhesive layer and a layer of solder bonding material, over which a solder layer is formed in selective regions and the underlying layers are etched using solder regions as a mask.

21 Claims, 5 Drawing Sheets

ELECTROPLATED SOLDER TERMINAL

This application is a divisional of application Ser. No. 08/267,339, filed Jun. 28, 1994, which is now abandoned.

FIELD OF INVENTION

The present invention relates generally to solder interconnection used in microelectronics packaging and in particular to an improved solder terminal metallization.

BACKGROUND OF THE INVENTION

In microelectronics, the term interconnection is often used to describe a structure or a method of electrically connecting an active device such as a semiconductor, capacitor or a laser to a ceramic substrate or an organic board. One type of interconnection called hard or semipermanent, uses a low melting solder alloy. This is in contrast to a removable connection, such as pins and sockets.

Flip chip joining is a major sub-set within the area of solder interconnection. In flip chip joining, the electrical and physical connection is established between a ceramic substrate or organic board and a circuitized silicon chip, by joining corresponding terminals on the silicon and ceramic substrate or organic board by means of solder balls or columns. In all following discussions, the term "substrate" is used to denote either a silicon chip, a ceramic substrate or an organic board. The solder material for the ball is usually formed at the terminal metallization on either device or substrate and sometimes on both. The fabrication of soldered terminals is an important manufacturing process for microelectronics.

In applications where the quantity of solder in the solder interconnection is less critical and the features are relatively large (on order of a millimeter), dip, screen or spray soldering can be used. In critical applications where the volume and composition of solder need to be controlled tightly (less than 25% variation), solder terminal is fabricated by either evaporation of solder through a metal mask or resist mask, or plate up of solder through a resist mask. In general, the solder terminal on a substrate can be considered to be made of two parts, one a metallized layer referred to as terminal metallization, and the other a body of joining material (usually a solder). A separate terminal metallization is usually required since interconnection metals such as aluminum, chromium, molybdenum, tungsten etc., used for wiring on devices and substrates are not suitable since they are not easily wetted by and do not chemically react with solder in a controlled manner. U.S. Pat. No. 3,633,076 teaches a solder interconnection, in which the metallization requirements of a solder terminal are listed as electrical conductivity, adhesion/mechanical stability, ease of deposition and photo-processing, solderability and material stability in processing. U.S. Pat. No. 3,633,076 further teaches the use of a three layer metallization on a semiconductor, in order to satisfy these several opposing requirements. These requirements continue to be valid even now; however, additional new requirements have emerged for very large scale integrated devices. Some of the new requirements are, very high number of terminals (for increased number of inputs/outputs), precise placement of terminals, high mechanical stability (such as stress and adhesion) and low defect levels. For example, the stress due to terminal metallization has been found to result in formation of cracks in the thin insulating film underneath the metallization (Bhattacharya et al. U.S. Pat. No. 4,434,434). U.S. Pat. No. '434 teaches that a graded layered terminal metallization can reduce crack formation in the underlying brittle insulating film. Herdzik et al. (IBM Technical Disclosure Bulletin, p. 1979, vol. 10, No. 12, May 1968) discuss the use of overlying Al with Cr, Mo or W to prevent alloying of Al with solder when solder is reflowed. Leonard and Revitz (IBM Technical Disclosure Bulletin, p. 1121, vol. 13, No.5, October 1970) discuss the use of oxidized chromium as a barrier for use in solder terminals in conjunction with a phased Cr-Cu layer. Dalal and Jaspal (IBM Technical Disclosure Bulletin, p. 1005, vol. 20, No. 3, August 1977) describe a process of co-depositing Cr and Cu by evaporation to form a phased Cr-Cu layer. The Cr-Cu phased layer, which consists of mechanically interlocked Cr and Cu grains, has shown good adhesion to both the underlying Cr layer and to the overlying copper and copper intermetallic layer. Gardner et al (U.S. Pat. No. 4,840,302) teach the use of Cr-Ti alloy layer, instead of either Cr or Ti alone, as an adhesion layer to an organic insulator on which the terminal is formed. The U.S. Pat. No. '302 invention claims to reduce interface fractures when solder terminal is formed over an organic insulator.

There are other teachings that are specific to the manufacturing process of the solder terminal. The technical review article entitled "Solder Bump Fabrication by Electrochemical Method for Flip Chip Interconnection", by Kawanobe et al., (CH1671-7 IEEE, 1981 pp. 149–155), summarizes several alternate methods of forming solder bumps and underlying metallization. U.S. Pat. No. 5,162, 257 issued to Edward K. Yung, teaches a process for fabricating a solder bump. In the U.S. Pat. No. '257 process, blanket metal layers (including copper) are formed over a substrate with the topmost layer being a patterned solder dam layer such as chromium (solder dam is a material that solder does not wet on melting). Regions of solder accumulation are formed on the substrate and the solder is reflowed to react with copper not covered by solder dam layer. This is followed by etching away the solder dam layer and other metallization layers using the solder and the intermetallic layer as an etch mask. U.S. Pat. No. 5,268,072, assigned to the assignee of the present invention, teaches a combination of wet and dry etch methods to form a graded or stepped edge profile of a three layer metallization Cr/Cr-Cu/Cu.

Each of the prior art teachings reviewed above, attempts to provide a solution to a specific problem encountered in their solder fabrication and use. However, none of the solutions appears to permeate across different applications. This is because, even though most interconnection terminal requirements are common to all uses, there are requirements that are unique to each use. Further, it is quite apparent that solder terminal formation technology is not easily predicted and experimental verification is often required for validation of any change in metallization or process. A primary objective of the present invention is to achieve a higher manufacturing yield and improve reliability of solder terminal and at the same time extend the process to form smaller and greater number of solder terminals on large substrates (e.g. 200 mm Si wafer) at reduced cost. It will become apparent from follow on specific discussions in the detailed description section, that many of the prior inventions do not adequately meet this primary objective of the present invention.

OBJECTS OF THE INVENTION

An object of the present invention is to provide an interconnection solder terminal structure and a manufacturing process for it with improved yield and reliability.

A further object of the present invention is to provide a low cost manufacturing process, usable on large substrates.

A still further object of the present invention is to improve compatibility of the process with substrates containing multilevel wiring made of thin Al-Cu, Cu lines and thin passivation layers.

SUMMARY OF THE INVENTION

A process and a structure for an improved solder terminal is disclosed. The improved solder terminal is made of a bottom metallic adhesion layer, a CrCu layer on top of the adhesion layer, a solder bonding layer above the CrCu layer and a solder top layer. The adhesion layer is either TiW or TiN. A process for fabricating an improved terminal metal consists of depositing an adhesive metallic layer, a layer of CrCu over the adhesive layer and a layer of solder bonding material, over which a solder layer is formed in selective regions and the underlying layers are etched using solder regions as a mask.

BRIEF DESCRIPTION OF THE DRAWINGS

The objects, features and advantages of the present invention will be apparent from the following more particular description of the invention illustrated in the accompanying drawings, in which.

DETAILED DESCRIPTION OF THE INVENTION

Figure 1:
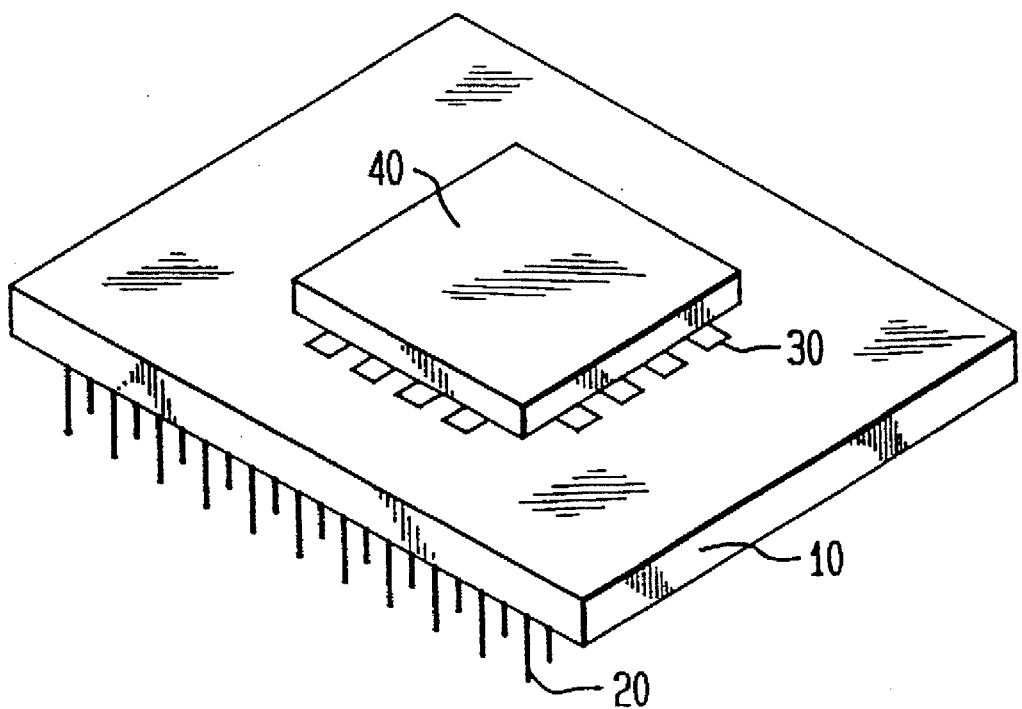
FIG. 1 illustrates a pictorial view of a microelectronics sub-assembly employing a flip-chip interconnection.

FIG. 1 shows a sub-assembly (module) using flip chip interconnection, wherein a semiconductor chip 30, is joined electrically and physically to a ceramic substrate 10, by means of a plurality of solder bumps 40. The solder bumps 40 are connected on one end to the terminal metallization on chip 30 and connected on the other end to the terminal metallization on substrate 10. The solder bumps 40, have been reflowed to establish a metallurgical bond between solder and terminal metallization on chip 30 and on ceramic substrate 10. Usually, prior to joining, solder is prefabricated as an integral part of chip 30 or substrate 40 or both. In some cases, solder preforms are used that are not integral part of chip 30 or substrate 10. In other types of interconnection, the terminals on the substrate are pre-soldered, and joined by means of a TAB (tape automated bonding) connection. In some cases, the reflowed solder is used as a thermal connection for mounting the backside of a chip onto a ceramic substrate, and electrical connection is established by means of TAB or wire bonding. Even though not specifically illustrated herein, the discussions made here equally apply to ceramic grid arrays, tape ball grid arrays and the like. The features of the present invention is illustrated here by considering the formation of solder bumps on a semiconductor chip 30, but it should be understood that substantially similar discussions can be made with other applications mentioned above.

Figure 2:
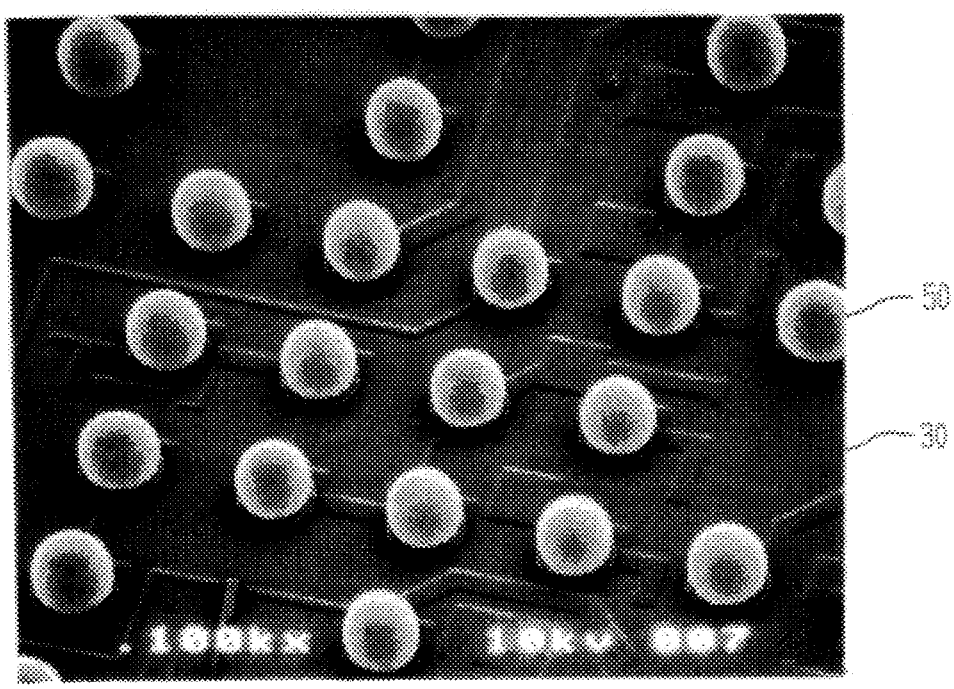
FIG. 2 shows a scanning electron micrograph of a semiconductor chip illustrated in FIG. 1, having a plurality of soldered terminals.

FIG. 2 shows a plurality of solder terminals or bumps 50 on the surface of a semiconductor chip 30. The location, number and size of the solder bumps 50 is usually determined by design requirements of the chip and ceramic substrate, module reliability and solder terminal process limitations. The total number of interconnections used in VLSI logic packaging at present is about 1000 and expected to increase. Therefore, the reliability required of a single terminal pad is quite high.

Figure 3:
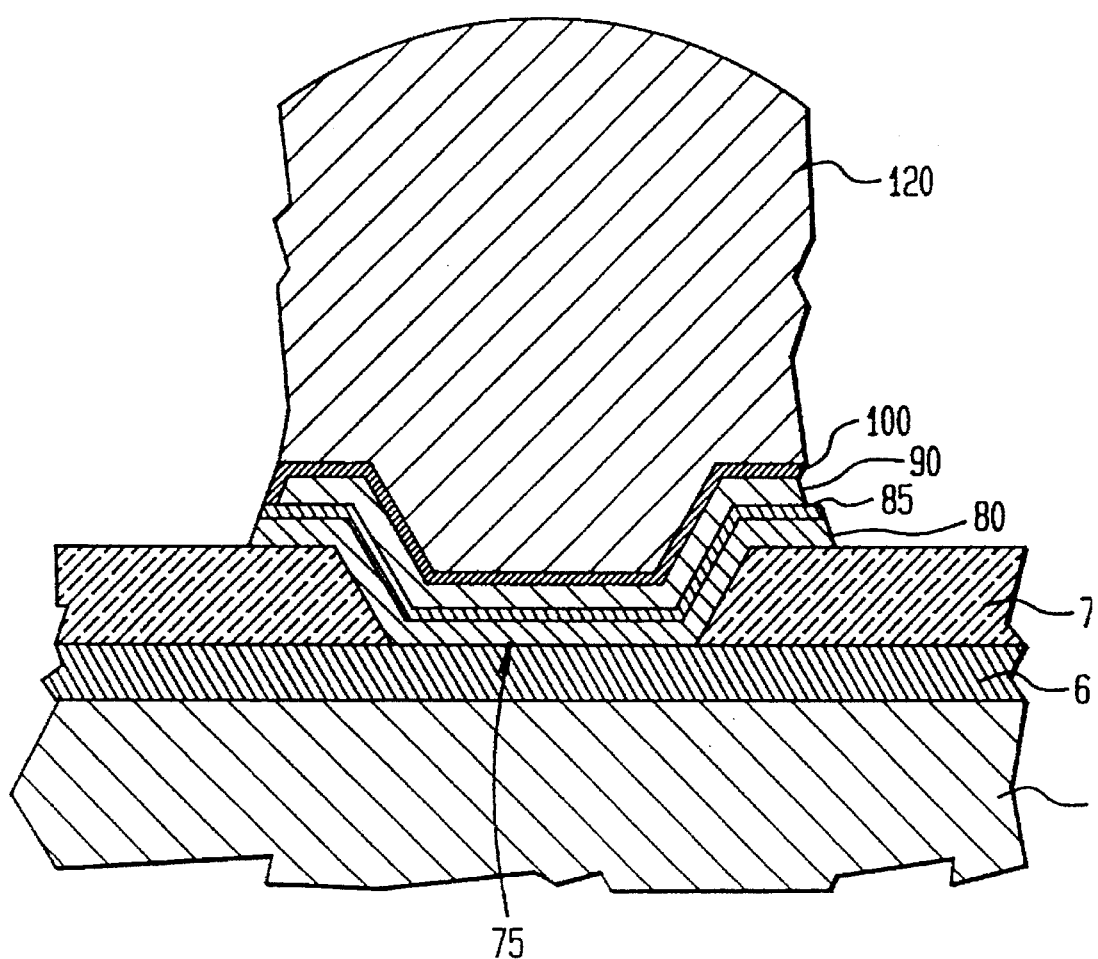
FIG. 3 shows a cross-sectional view of a solder terminal on the semiconductor chip shown in FIG. 2.

FIG. 3 shows some key elements of a solder bump on a chip which is called Controlled Collapsible Chip Connection (C4) (P. A. Totta and R. P. Sopher, IBM Journal Research and Development, May 1969, pp. 226–238). FIG. 3 will be used to review some of the salient features of prior art and also to highlight key embodiments of the present invention. The semiconductor chip 30, contains therein at least one level of patterned wiring 60 which is insulated and passivated by a thin insulation layer 70. An opening 75 or a via is formed in insulator 70 to underlying wire 60, corresponding to the location of the intended solder bump terminal. In the prior art, layer 80 is made of approximately 1KÅ of Cr, which provides adhesion to insulator 70, while at the same time makes electrical contact to layer 60 through opening 75. Opening 75 is shown as a via in FIG. 3, however in many applications, it can be replaced by a conductive contact (not shown) made by a screened-in and fired metallic paste in a ceramic substrate or plating up the hole in a plastic or ceramic board. Layer 90 is usually 5KÅ to 10KÅ of copper or nickel or other suitable solderable material, which reacts to form a metallurgical bond with the solder on heating of the solder. An intermediate layer 85, which is typically about 1500Å of phased Cr-Cu, is formed between layers 80 and 90, to provide adhesion between layer 90 and layer 80 if required. Layer 100 is sometimes formed over layer 90, composed of about 1KÅ of Au, for the purpose of protecting Cu surface from oxidizing during storage and handling prior to depositing solder layer 120. Layer 120, solder, usually contains one or more of Pb, Bi, Sb, Sn, In, Ag, Au. On heating to melt the solder (reflow), Cu layer 90 reacts with at least one constituent of the solder layer 120, forming intermetallic compounds (not shown) such as CuSn, CuIn and CuSb etc. The metallurgical reaction between Cu and solder (called wetting) converts part or all of Cu layer 90 into intermetallics. The actual composition of the intermetallics is determined by the compounds that are energetically favored. Phase diagrams on elements, for example Cu and Sn, contain information as to which intermetallics can form. Phase diagrams on two element systems (binary) are available in books on phase diagrams. When solder is subjected to reflow multiple times for repairing the module, Cu-Sn intermetallics (not shown) grow in thickness, become coarse and become discontinuous. Some of the intermetallics is dispersed into solder, which is referred to as "solution assisted spalling" (Berry and Ames, IBM J. Res. Development, May 1969, pp. 286–296). Berry and Ames observe that "prevention of solder dewetting is largely dependent on those factors which ultimately inhibit or arrest the spalling process. These factors are optimized in production by the use of the Cr-Cu phasing-in . . . ". The protective layer 100 is consumed completely in the joining cycle and forms intermetallic compounds which are usually dispersed within the solder bump.

The choice of specific thickness for individual layers, their order of arrangement and the chosen process of deposition and patterning is determined by a wide range of requirements discussed earlier such as process compatibility, film stress, interlayer adhesion etc. At the same time, the patterning processes available to select from are finite and may impose additional restrictions.

The present invention uses a combination of process steps such as deposition of blanket layers, masking and photolithography, addition of solder to selective areas and subtractive etching of blanket layers, to realize a low cost manufacturing process which is extendable to large wafers and small terminal features. The materials, their thickness and etch processes for different layers are selected and optimized to improve yield and reliability. Further, the process and structure of the solder terminal of the present invention is selected to assure compatibility between different layers and processes. A specific problem, the present invention is set out to overcome, is a residue defect and yield loss seen when prior art technique was used to etch metallization layers using overlying solder features as a mask. For example, U.S. Pat. No. 5,268,072 teaches electroetching of CrCu alloy layer and the Cu bonding layer. The term CrCu layer used in the body of this application will include all films that contain both Cr and Cu atoms irrespective of whether they are deposited from an alloy target or co-evaporated in a phased-manner from two separate sources. The term CrCu alloy layer thus will include phased Cr-Cu layer in its definition. In U.S. Pat. No. '072 process, solder is added to the terminal metallization at selected locations. Cu and CrCu layers are etched electrolytically using solder bump as a mask. However, the electrolytic etching of CrCu layer in U.S. Pat. No. '072 process also etches underlying Cr layer. Process non-uniformities and batch variations often results in partial etching of Cr layer before the CrCu layer is completely etched. The Cr layer, which is used as the electrical path during electroetching of CrCu layer, becomes discontinuous, thereby preventing the complete removal of CrCu layer and leading to yield losses. The overall manufacturability of electroetch process is impaired.

Based on this discussion, the present inventors have recognized a new process/material requirement in the selection and fabrication of terminal metallization, which can be described by use of FIG. 3 as follows: the selected etch process for removing unwanted portions of the top metallization layers to form layers 85 and 90 should not etch the underlying adhesion layer 80. This requirement can be satisfied by developing a new etch process or by use of a new material in place of Cr for layer 80 in FIG. 3. A new material choice, however will require a demonstration that the new adhesion layer 80 in combination with a barrier layer 85 and a solder bonding layer 90 can satisfy the many interrelated requirements discussed earlier. The present inventors have further recognized another requirement for a good manufacturing process, which is that the process used to etch adhesion layer 80 in FIG. 3, must further not etch wiring layer 60 exposed in areas within substrate 30. This issue can be better understood with the aid of FIGS. 4A and 4B.

Figure 4A:
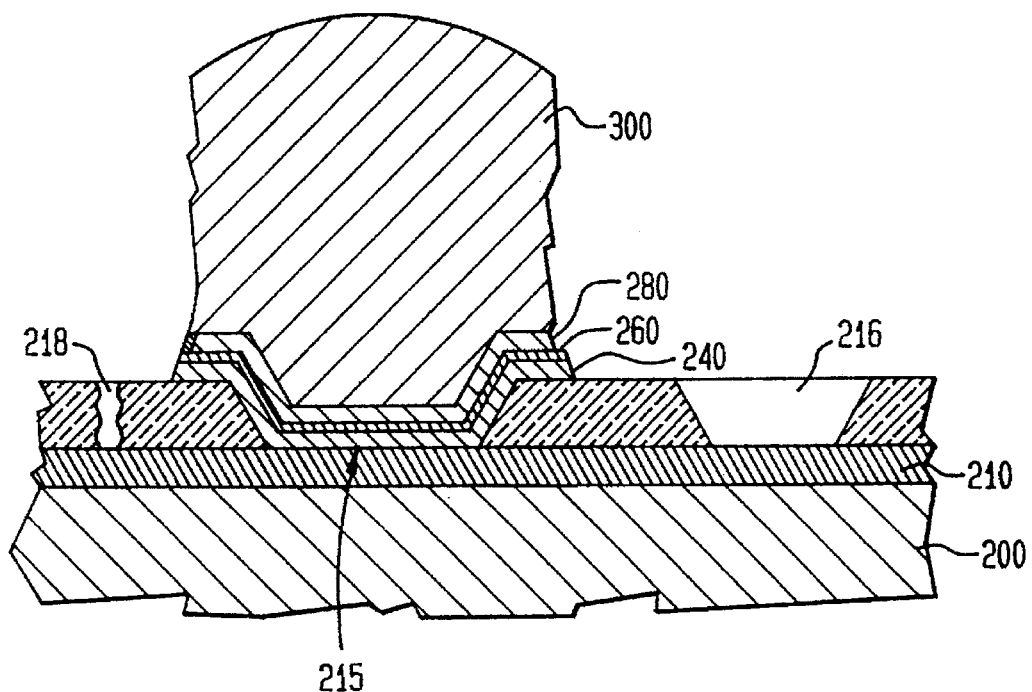
FIGS. 4A and 4B illustrate cross-sectional views of two different substrate configurations using a solder terminal and show regions of substrate that need to be protected during the solder terminal etch process.
Figure 4B:
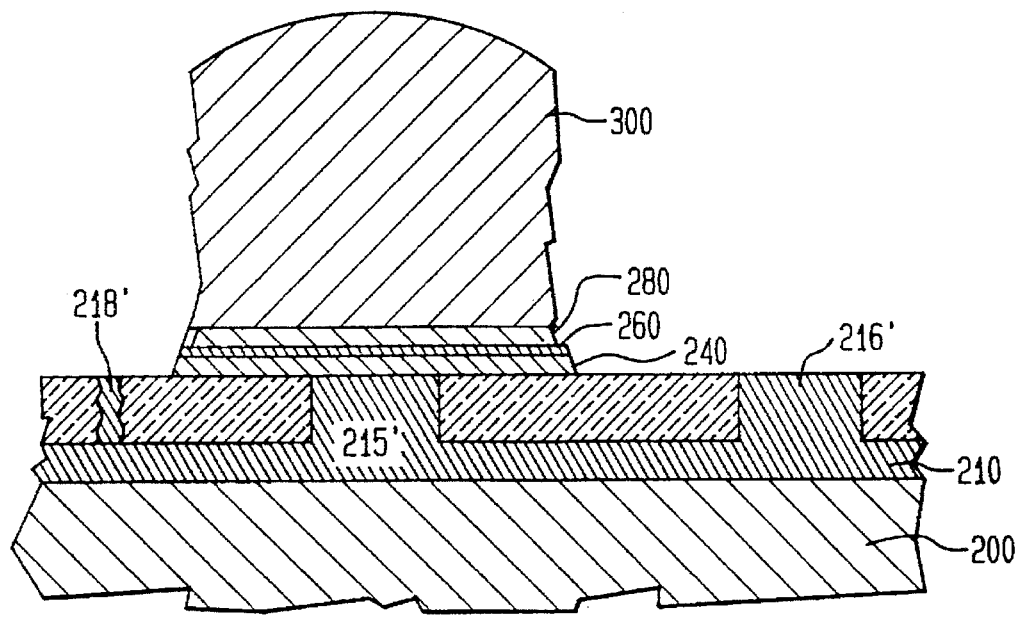

FIG. 4A shows a via contact opening 215, on a substrate 200, and a terminal metallization composed of an adhesion layer 240, an optional bonding layer 260 and a solderable layer 280, and a solder layer 300. With respect to earlier discussion, layer 240 can be Cr, layer 260 can be CrCu and layer 280 can be Cu or Ni. FIG. 4A also shows an intentional opening 216 to the buried wiring layer 210 in the substrate. Opening 216 is an intentionally exposed contact, that can be used for externally connecting to the wiring layer 210 by a technique other than by flip chip interconnection, such as wirebond, TAB etc., or probing test devices in the "kerf" region. Also shown in FIG. 4A, is an inadvertent opening caused by a defect 218 which exposes part of buried wire 210. The defect 218 can be a pinhole, an etch or a deposition defect. FIG. 4B is similar to FIG. 4A, except that the terminal utilizes a studded contact 215' instead of via contact 215. In the studded contact process, a metallic deposition is used to fill up the contact opening. In the case of an intentional opening, a studded surface 216' is exposed and in the case of a defect 218, a defective connection 218' is formed. Intentional openings 216 are included in some semiconductor chips to allow flexibility in use of different interconnections and use it with different substrates.

In the presence of these intentional and unintentional openings in the substrate top layer, the inventors have recognized that the selection of metallization layer 240 and process used for removing unwanted portions of layer 240 need to be "compatible" i.e non-attacking and non etching, to layer 210. Otherwise, in a manufacturing environment, the etch step for removing unwanted portions of layer 240 can lead to partial or complete etching of portions of wire 210 in the intentional or defect openings. A partial etch can result in reliability failures, while a complete etch can lead to yield loss. This concern was neither recognized in the prior art and nor solved by the prior art. For example, U.S. Pat. No. 5,162,257, which teaches forming a solder bump with metallization layers Cr, phased Cr-Cu, and Cu, uses hydrochloric acid based etchant (col 6, lines 24–26) for etching Cr-Cu and Cr layers. It is known that hydrochloric based etchants violently attack exposed Al surface making this teaching not readily suitable for large scale manufacturing of solder terminals on substrates having Al wiring. The present inventors have recognized that for a high yielding manufacturing process, a process used to etch adhesion layer 240 of the terminal metallization in FIG. 4A, must be compatible with (i.e not etch) the buried wiring layer 210. It is not always easy to modify etching conditions and chemicals, since specific etching conditions are required to control the geometric shape of the etched metallization layers (a tapered profile) in order to minimize stress induced cracks in the underlying insulators.

Figure 5:
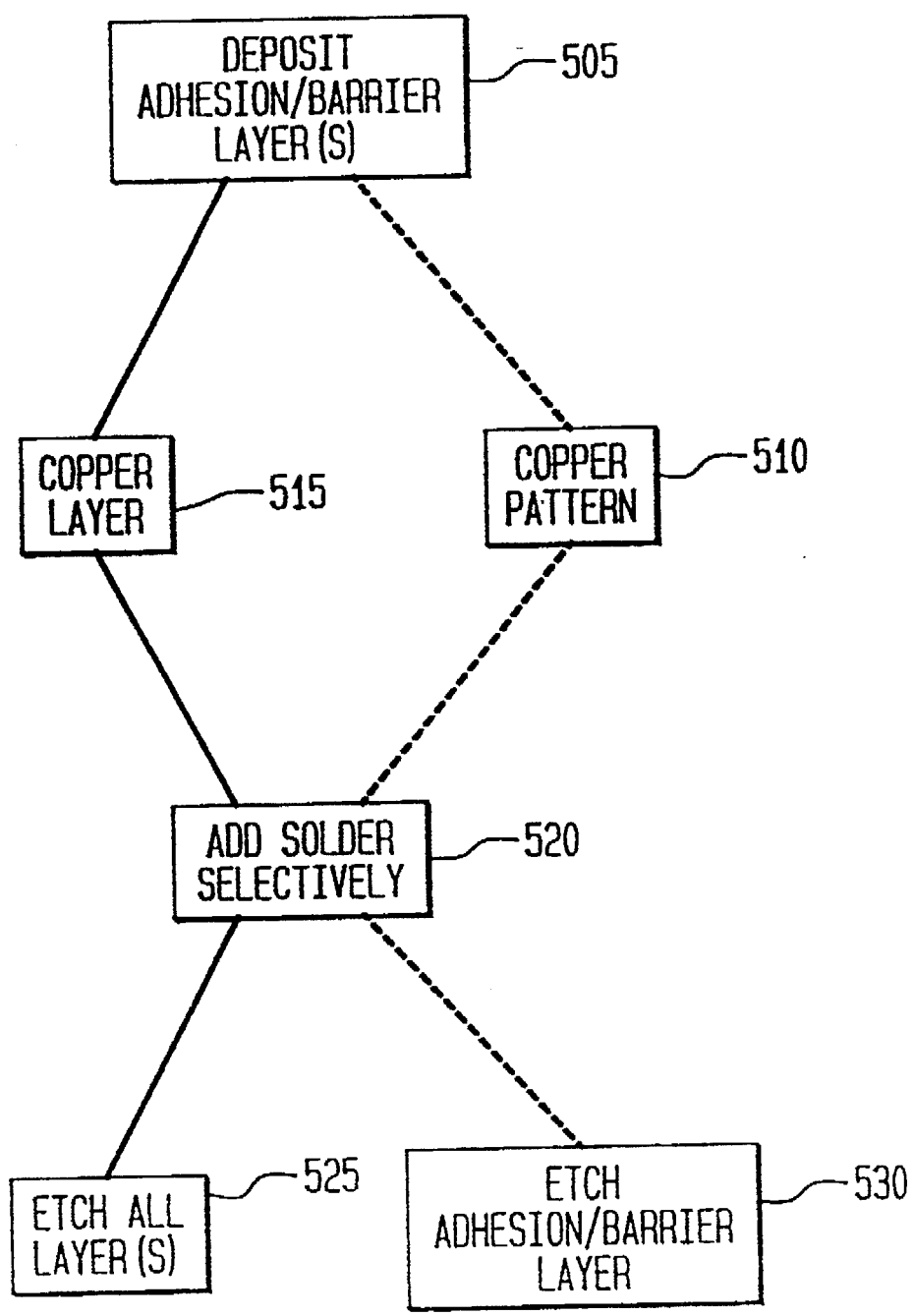
FIG. 5 is a block diagram illustrating the process steps of the present invention.

A preferred embodiment of the present invention can be understood by use of FIG. 5 showing the process steps by means of a block diagram, in conjunction with the cross sectional view shown in FIG. 3. The first step 505, consists of depositing one or more blanket metallization layers on a substrate 30 having a top insulating layer 70 and a contact region 75. Layers 80 and 85 of FIG. 3 are formed when unwanted portions are removed from above blanket layers at a later process step. In most practical cases, substrate 30 will have several contact regions 75. In the preferred process, a layer of TiW is sputtered from an alloy target as a blanket layer, which will be etched selectively at a later process step to form layer 80 of FIG. 3. TiW deposition is followed by sputter depositing a CrCu layer from a CrCu alloy target, and a Cu layer from a Cu target, the Cu and CrCu layers selectively etched at a later step to form layers 90 and 85 respectively of FIG. 3. The CrCu layer can also be deposited by other techniques, such as co-sputtering from two elemental targets or co-evaporating from two evaporation sources. Irrespective of the technique used, the resultant film is a mixture of Cr and Cu grains that are physically mixed and have interlocking grains. A layer of TiN can be used as an alternate to TiW layer in the present application. This is because, TiN, like TiW, has good adhesion to insulators and is a good diffusion barrier to metallization used in microelectronics applications. Both TiN and TiW can be etched using plasma containing fluoro-carbon species, which does not etch Al, Cu, or Pb-Sn. When fluoro-carbon plasma is used for etching, the formation of a fluoride surface layer over Pb-Sn layer 120 can be a concern and may require additional processing steps to remove it prior to or during joining of solder interconnection. Further, reactive ion etch process using fluoro-carbon require tight process control and uniformity as the process can etch underlying insulating layer 70 in FIG. 3. Too much loss in the thickness of insulation layer 70 can be unacceptable for many applications. In the preferred process, the insulating layer 70 in FIG. 3 is a polyimide having a chemical composition PMDA-ODA (pyromellitic dianhydride-oxydianiline). However, organic materials of any chemical composition that is suitable as an insulator for microelectronics application can be used as layer 70. In addition, inorganic insulators such as silicon dioxide, silicon nitride and silicon oxy-nitrides deposited by physical, thermal and PECVD processes can also be used as layer 70.

The thickness of TiW layer 80 can range from 250Å to 2000Å. In some applications, the substrate is sputter etched prior to TiW deposition, to assure low electrical resistance and good adhesion. The tungsten amount in the sputter target is usually about 90 atomic percent, however it can range from 60 to 90 atomic percent, the balance being Ti. CrCu layer 85, has a thickness of 100Å to 2000Å. The composition of CrCu layer 85 has Cr amount ranging from 20 to 80% with the balance being Cu. In the preferred embodiment, TiW sputter target contained 90 atomic percent W, and the CrCu sputter target contains equal amount of Cr and Cu by volume. Although sputtering is the preferred process, the layers 80 and 85 in FIG. 3 prior to etching are blanket in nature, and other techniques such as plating, evaporation, CVD can also be used.

After the deposition of the TiW and CrCu layers, two alternate processes can be used for depositing copper. In one process step 510, a patterned Cu layer is formed on top of the CrCu layer, either by depositing through a resist or a metal mask. Alternatively a patterned Cu layer can also be achieved by depositing a blanket layer and subtractively etching it using a resist mask. This method of patterning copper as in step 510, has too many process steps compared to the preferred step 515 in the block diagram FIG. 5. In step 515, copper layer which correspond to layer 90 in FIG. 3, is deposited as a blanket layer, preferably by sputtering from a copper target. The thickness of Cu can range from 1000Å to 2 microns depending on the application. A thickness of 4300Å of copper is used in the preferred process. Alternatively, a layer of nickel or cobalt, known for their solderability, can be used in place of copper to form layer 90 in FIG. 3. In our experiments, an inline sputtering system MRC 662 with multiple targets was used to deposit TiW, CrCu and Cu layers sequentially in a single pumpdown. Next, as shown in process step 520, an insulating mask layer is formed with apertures corresponding to solder terminal locations. In the preferred process, the mask is made of negative dry film resist. Other mask materials such as positive resists, insulators such as polymers, silicon oxides, nitrides and mixtures thereof, can also be used. In the preferred process, Pb-3Sn solder alloy is plated through the apertures in the insulating mask layer, substantially filling and, if required, over-filling the aperture volume. The electro-plating process uses known plating formulations and plating apparatus and further uses blanket metallization layers TiW, CrCu and Cu underneath the insulating mask layer for providing electrical path for the plating operation. Other desired solder compositions such as eutectic Pb-Sn, Pb-In, Pb-In-Sn etc. can also be plated using widely known processes in the industry. Thus, in step 520, solder is selectively added to the substrate at the location of the apertures to form layer 120 of FIG. 3. After the solder is formed by plating, the mask is removed by wet or dry etching in step 520. In the case of organic resist, ashing in O2 was used to remove the mask layer.

In step 525, unwanted regions of blanket bonding layer Cu, Ni or Co and intermediate layer CrCu and bottom adhesion layer TiW or TiN or similar are removed from areas outside of solder regions to form layers 90, 85 and 80 respectively of FIG. 3. In the preferred process, the Cu and CrCu layers are first electroetched with potassium sulfate etchant as taught in U.S. Pat. No. 5,268,072, assigned to the assignee of the present invention. The present inventors have found that the preferred embodiment TiW layer 80 is unetched by the electroetch process used to remove Cu and CrCu layers in the exposed areas. This allows the TiW blanket layer to provide a path for electrical current for electroetching (and some overetching) of overlying layers copper and CrCu to form layers 90 and 85, without leaving any residues. In step 525, following the formation of CrCu layer 85 and Cu layer 90, TiW blanket layer is etched chemically by using a buffered mixture of $H_2O_2$ such as taught in U.S. Pat. No. 4,814,293. In the preferred process a mixture of $H_2O_2$, EDTA and a passivant is used. This etchant selectively removes TiW and does not appreciably attack Cu, Al and CrCu layers.

Thus, a viable sequence of process steps, for forming the preferred embodiment of the present invention of a multilayer metallization structure, composed of TiW or TiN as the bottom adhesive layer 80, CrCu intermediate layer 85 and Cu bonding layer 90, in a mutually compatible and reliable manner has been shown. However, it is still needed to be determined whether the selected layers form good interfaces with each other and with the insulating layers. An experimental verification of the mechanical integrity of the three layers and the entire interconnection needed to be completed to finalize the utility of the invention. A good mechanical integrity of the interconnection structure assures that both good choice of materials and also good choice of processes have been made. A reliable technique for assuring the mechanical integrity and adhesion of the solder terminal is a tensile pull test. In a tensile pull test, the chip is joined to a substrate by a solder interconnection as in FIG. 1, and the chip and substrate are mechanically pulled apart. When the test is performed properly, the separation will occur in a part of the solder interconnection. If the separation occurs within solder volume by ductile deformation of the solder, then one can conclude that the interfaces between the metallization layers and the insulator on the chip or substrate are sound. A separation among one of the metallization layers or from the insulation surface indicate poor mechanical integrity. The pull test can be made more aggressive by subjecting the interconnection to repeated melting of solder (reflows) a number of times in a non-oxidizing ambient prior to the test.

Table 1 lists the results of pull test on an interconnection subjected to 30 reflows, where the chip terminals are formed by using the present invention with various TiW, CrCu and Cu thicknesses. The results in table 1 contain, actual number of chips that are pull tested in each combination of thickness of the metallization layers, the average pull strength of chips in each category and number of solder bumps that showed interface delamination.

TABLE 1

PULL TEST RESULTS
TiW/Cr—Cu/Cu/Pb-3Sn - AFTER 30 REFLOW CYCLES

| Expt No. | TiW Å | Cr—Cu Å | Cu Å | # Chips Pulled | Ave Pull lbs | # Solder Delam/ 400 pads |
|---|---|---|---|---|---|---|
| 1 | 812 | 1187 | 3150 | 3 | 20.2 | 0 |
| 2 | 812 | 562 | 3150 | 3 | 18.4 | 85 |
| 3 | 625 | 875 | 4300 | 3 | 20.1 | 0 |
| 4 | 437 | 1187 | 3725 | 3 | 21.1 | 0 |
| 5 | 437 | 250 | 3725 | 3 | 19.7 | 12 |
| 6 | 812 | 1500 | 4300 | 3 | 21.8 | 0 |
| 7 | 437 | 1187 | 3725 | 3 | 21.9 | 0 |
| 8 | 250 | 1500 | 2575 | 3 | 19.9 | 0 |

Test results correspond to 250Å of CrCu and 562Å of CrCu both shows a decrease in pull strength and some interface fails. Since the number of test chips were only three, the actual values are not as significant. However, we can conclude that there is a tendency for interface fails in a pull test for thinner CrCu. The implication is that in the absence of a finite CrCu layer, the solder bump will result in dewetting of TiW, a known oxidizing, self-passivating film. The number of interface fails is not bad given that the interconnections were subjected to 30 reflows prior to testing. This would suggest that the adhesion between TiW and CrCu layer is sound and perhaps that the limited fails are due to degradation of the thinner CrCu layer from 30 reflows. It is important to note that in regards to resisting spalling, alloy CrCu layer seem to be effective similar to the phase-in Cr-Cu layer. This further suggest that for most applications, where the number of reflows are about 10 or less, even 250Å of CrCu intermediate layer is probably acceptable. However, following the same reasoning that a thin Cu layer of the order of 5KÅ, directly on TiW without intermediate CrCu layer, can lead to interface delaminations as Cu is converted to Cu-Sn intermetallic and the intermetallics spalls into solder bulk. Therefore, CrCu intermediate layer 85 in FIG. 3, plays a unique role, even when it is thin. The mechanical locking of the Cu grains assure adhesion between Cu-Sn intermetallic and CrCu layer on one end and Cr grains and locked Cu-Sn grains assure good adhesion with TiW on the other end. A similar conclusion may be inferred from an experimental study on "Reliability improvements in solder bump processing for flip chips", (M. Warrior, 1990 IEEE, 0589-5503, pp. 460–469). The Warrior study used an interconnection of plated solder with TiW and Cu as metallization layers without an intermediate layer. The interconnection was joined to a substrate and was pull tested. The study states in page 461 of the above reference, "as the adhesion is primarily dependent on good Cu-Ti mechanical bonding, any compromise is a potential bump-open failure. Studies were conducted by exposing the TiW surface to atmosphere prior to Cu sputter. This resulted in reproducing the same failure mode . . . ". In Warrior study, the copper thickness used was about 10KÅ (see FIG. 1, p. 460 of the reference), and the interconnection was subjected to one cycle of solder melting during the joining cycle. It is reasonable to conclude that after joining, the Cu-Ti interface was still maintained. Therefore the interface of concern is between Cu and Ti rich surface of the Ti-W layer, which appears to be very sensitive. From these discussions and the data in Table 1, for most microelectronics applications using thin bonding layer as envisioned in the present invention, the use of TiW and Cu without an intermediate layer will not meet the yield and reliability objectives set forth in the present invention. Thus, the use of a thin CrCu intermediate layer 85 in between the TiW layer 80 and Cu (or Ni) layer 90 of the present invention, provides an important solution. CrCu stays as an integral layer through multiple reflows and provides good adhesion to underlying TiW layer as shown by the test results.

Based on preceding discussions, a terminal metallization as shown in FIG. 3, can use any of the following materials TiN, Ti/TiN, Ti/TiW and Ti/W and similar material to form adhesion layer 80, along with a CrCu intermediate layer 85. However, the adhesion layer 80 should not be etched in a process that etches CrCu layer 85, which implies that any Cr or Cu containing layer is unlikely to be suitable for layer 80. In the case of layered structures such as Ti/W, Ti provides adhesion to the substrate. Further, based on the mechanistic discussions on adhesion and the limited role of bonding layer, materials such as Nickel and Cobalt can be used in addition to Cu for bonding layer 90. In the case of use of layered structures made of Ti/W, Ti/TiW, Ti/TiN etc, fluorine based plasma can be used to etch these layers to form layer 80; additionally, wet etching techniques may be available that are selective to the buried wiring layer 60.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A solder terminal on a substrate containing at least one electrically conducting member and having a plurality of electrical contact regions separated by an insulator, comprising:

a metallic adhesion layer, etchable using a process selective to said electrically conducting member, overlying said insulator and in contact with one of said plurality of electrical contact regions;

a CrCu alloy layer overlying and in contact with said adhesion layer;

said process for etching the metallic adhesion layer further being selective to said CrCu adhesion layer;

a solder bonding metallic layer overlying and in contact with said CrCu layer; and, a layer of solder overlying and in contact with said solder bonding layer.

2. An improved solder terminal of claim 1, wherein said metallic adhesion layer is selected from a group consisting essentially of TiN and TiW.

3. An improved solder terminal of claim 1, wherein said metallic adhesion layer is made of two layers, a bottom Ti layer and a top layer selected from the group consisting essentially of TiN, TiW, and W.

4. A solder terminal of claim 1, wherein said metallic adhesion layer has a thickness in the range of 250Å to 2000Å.

5. A solder terminal of claim 1, wherein said metallic adhesion layer is preferably about 1000Å.

6. A solder terminal of claim 1, wherein said insulator is selected from a group consisting essentially of polyimides, silicon dioxide, silicon nitride and silicon oxynitride.

7. A solder terminal of claim 1, wherein said solder is selected from a group consisting essentially of Pb-Sn, Pb-In and Pb-Bi.

8. A solder terminal of claim 1, wherein said CrCu layer has a thickness greater than 250 Angstroms.

9. A solder terminal of claim 8, wherein said CrCu layer contains copper ranging from 20 to 80 atomic percent.

10. A solder terminal of claim 1, wherein said solder bonding layer is selected from a group consisting essentially of Cu, Co and Ni.

11. A solder terminal of claim 1, wherein said solder bonding layer has a thickness selected from the range of 1000Å to 2 microns.

12. A solder terminal on a substrate containing at least one electrically conducting member and having a plurality of electrical contact regions separated by an insulator, comprising:

a metallic adhesion layer, selected from a group consisting essentially of TiN and TiW, overlying said insulator and in contact with one of said plurality of electrical contact regions;

a CrCu alloy layer overlying and in contact with said adhesion layer;

said metallic adhesion layer further being etchable selective to said CrCu layer;

a solder bonding metallic layer overlying and in contact with said CrCu layer; and, a layer of solder overlying and in contact with said solder bonding layer.

13. A solder terminal of claim 12, wherein said metallic adhesion layer is made of two layers, a bottom Ti layer overlying and in contact with said insulator and one of said plurality of electrical contact regions and a top layer overlying and in contact with said Ti layer, selected from the group consisting essentially of TiN, TiW, and W.

14. A solder terminal of claim 12, wherein said metallic adhesion layer has a thickness in the range of 250Å to 2000Å.

15. A solder terminal of claim 12, wherein said metallic adhesion layer is preferably about 1000Å.

16. A solder terminal of claim 12, wherein said insulator is selected from a group comprising polyimides, silicon dioxide, silicon nitride and silicon oxynitride.

17. A solder terminal of claim 12, wherein said solder is selected from a group consisting essentially of Pb-Sn, Pb-In and Pb-Bi.

18. A solder terminal of claim 12, wherein said CrCu layer has a thickness greater than 250 Angstroms.

19. A solder terminal of claim 18, wherein said CrCu layer contains copper ranging from 20 to 80 atomic percent.

20. A solder terminal of claim 12, wherein said solder bonding layer is selected from a group consisting essentially of Cu, Co and Ni.

21. A solder terminal of claim 12, wherein said solder bonding layer has a thickness selected from the range of 1000Å to 2 microns.

* * * * *